United States Patent
Vissenberg et al.

(10) Patent No.: US 10,584,835 B2
(45) Date of Patent: Mar. 10, 2020

(54) LIGHTING STRIP AND KIT

(71) Applicant: SIGNIFY HOLDING B.V., Eindhoven (NL)

(72) Inventors: Michel Cornelis Josephus Marie Vissenberg, Roermond (NL); Olena Ivanova, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 16/461,415

(22) PCT Filed: Nov. 20, 2017

(86) PCT No.: PCT/EP2017/079752
§ 371 (c)(1),
(2) Date: May 16, 2019

(87) PCT Pub. No.: WO2018/095853
PCT Pub. Date: May 31, 2018

(65) Prior Publication Data
US 2019/0346093 A1     Nov. 14, 2019

(30) Foreign Application Priority Data
Nov. 23, 2016    (EP) ..................................... 16200142

(51) Int. Cl.
*F21S 4/22*      (2016.01)
*F21V 5/08*      (2006.01)
(Continued)

(52) U.S. Cl.
CPC ................. *F21S 4/22* (2016.01); *F21S 8/036* (2013.01); *F21V 5/08* (2013.01); *F21V 7/0016* (2013.01);
(Continued)

(58) Field of Classification Search
CPC .... F21S 4/22; F21S 8/036; F21V 5/08; F21V 7/0016; H05K 1/18; H05K 2201/10106; F21Y 2115/10; F21Y 2103/10
See application file for complete search history.

(56) References Cited

U.S. PATENT DOCUMENTS

| | | |
|---|---|---|
| 9,458,972 B1 | 10/2016 | Dong et al. |
| 2011/0096533 A1 | 4/2011 | Sekela et al. |
| (Continued) | | |

FOREIGN PATENT DOCUMENTS

| | | |
|---|---|---|
| CN | 101113806 A | 1/2008 |
| DE | 102015001552 A1 | 8/2016 |
| (Continued) | | |

*Primary Examiner* — Joseph L Williams
*Assistant Examiner* — Jose M Diaz
(74) *Attorney, Agent, or Firm* — Daniel J. Piotrowski

(57) ABSTRACT

A lighting strip (10) is disclosed comprising a carrier (11) carrying, on at least one of its major surfaces (13), a plurality of solid state lighting elements (15) distributed along an elongation direction of said carrier; a first optical arrangement (21) along said elongation direction for creating a first redistribution of a first portion of the luminous output of said solid state lighting elements; and a second optical arrangement (23) along said elongation direction for creating a second redistribution of a second portion of the luminous output of said solid state lighting elements, wherein the first redistribution is different to the second redistribution. A surface illumination kit including a plurality of such lighting strips is also disclosed.

15 Claims, 6 Drawing Sheets

(51) Int. Cl.
  *F21V 7/00* (2006.01)
  *H05K 1/18* (2006.01)
  *F21S 8/00* (2006.01)
  *F21Y 103/10* (2016.01)
  *F21Y 115/10* (2016.01)

(52) U.S. Cl.
  CPC ............ *H05K 1/18* (2013.01); *F21Y 2103/10* (2016.08); *F21Y 2115/10* (2016.08); *H05K 2201/10106* (2013.01)

(56) References Cited

U.S. PATENT DOCUMENTS

| | | |
|---|---|---|
| 2014/0362566 A1 | 12/2014 | Tischler et al. |
| 2015/0360606 A1 | 12/2015 | Thompson et al. |
| 2016/0123564 A1 | 5/2016 | Quilici et al. |

FOREIGN PATENT DOCUMENTS

| | | |
|---|---|---|
| EP | 1813857 A1 | 8/2007 |
| EP | 2233831 A1 | 9/2010 |
| EP | 2454520 A1 | 5/2012 |
| EP | 2484956 A1 | 8/2012 |
| EP | 3021037 A1 | 5/2016 |

LIGHTING STRIP AND KIT

CROSS-REFERENCE TO PRIOR APPLICATIONS

This application is the U.S. National Phase application under 35 U.S.C. § 371 of International Application No. PCT/EP2017/079752, filed on Nov. 20, 2017 which claims the benefit of European Patent Application No. 16200142.4, filed on Nov. 23, 2016. These applications are hereby incorporated by reference herein.

FIELD OF THE INVENTION

The present invention relates to a lighting strip comprising a carrier carrying, on at least one of its major surfaces, a plurality of solid state lighting elements distributed along an elongation direction of said carrier and to a surface illumination kit comprising a plurality of such lighting strips.

BACKGROUND OF THE INVENTION

Surface illumination such as ceiling illumination has attracted considerable interest, for example to create a homogeneously lit space adjacent or below the surface in order to create comfortable working conditions, or to create light patterns on the illuminated surface, e.g. light stripes, in order to create an aesthetically interesting and invigorating illumination pattern on the surface.

Recently, solid state lighting (SSL) solutions, e.g. LED-based luminaires, have been proposed for such surface illumination, due to the superior lifetime, robustness and energy consumption characteristics of SSL devices compared to traditional light sources such as incandescent and fluorescent light sources. An example of such a SSL solution is given by US 2014/0362566 A1, which discloses a lighting system that includes a flexible light sheet and one or more sealed regions containing light-emitting elements, the sealed regions defined by seals between a top housing and bottom housing and/or the light sheet. Such a lighting system may be applied to curved surfaces and used as a ceiling luminaire but is less suitable for creating aesthetic luminous distributions such as light stripes along a target surface, e.g. a ceiling.

It is known to deploy lighting strips comprising a plurality of SSL elements in an elongation direction of the lighting strip in ceilings, e.g. in between the ceiling tiles of a modular ceiling. However, due to their positioning within the ceiling, such lighting strips provide direct illumination of the space below the ceiling, which can be perceived as rather bright and uncomfortable. It would be possible to suspend such lighting strips below the ceiling and direct the luminous output of the SSL elements towards the ceiling in order to create luminous pattern on the ceiling and indirectly illuminate the space below the ceiling through reflection and scattering effects. This arrangement has the disadvantage that the lighting strips when viewed from below are visible as a dark stripe along the ceiling, which is aesthetically undesirable.

SUMMARY OF THE INVENTION

The present invention seeks to provide a lighting strip that may be used to illuminate a target surface in a more unobtrusive manner.

The present invention further seeks to provide a surface illumination kit comprising such lighting strips.

According to an aspect, there is provided a lighting strip comprising an L- or T-shaped carrier having an ascender and at least one-cross-bar and carrying as a light source, on at least one major surface of the ascender, a plurality of solid state lighting (SSL) elements distributed along an elongation direction of said carrier, the ascender further being provided with mounting means for mounting to a surface; a first optical arrangement along said elongation direction and being in axial direction if in front of the light source for creating a first redistribution of a first portion of the luminous output of said solid state lighting elements; and the at least one cross-bar being a second optical arrangement along said elongation direction for creating a second redistribution of a second portion of the luminous output of said solid state lighting elements, wherein the first redistribution is different to the second redistribution.

The features of "ascender" and "cross-bar" are well-known in typeface anatomy, define the orientation of the lighting strip, and are clear to a skilled person in the art, see for example https://en.wikipedia.org/wiki/Typeface_anatomy. The present invention is based on the insight that when the above lighting strip is arranged relative to a target surface to be illuminated, e.g. a ceiling surface, such that the respective optical axes of the SSL elements are arranged substantially in parallel with the target surface, a first portion of their luminous output may be redistributed by the first optical arrangement towards the target surface whilst a second portion of their luminous output may be redistributed by the second optical arrangement such that at least part of the second portion is directed away from the target surface, thereby ensuring that the redistributed first portion may be used to create desirable aesthetic effects such as light stripes on the target surface whilst the redistributed second portion ensures that the lighting strip when observed from below the target surface is not clearly visible as a dark line against the surface. Mounting means could, for example, be a bracket, an adhesion surface, a slot, a threaded end, or a suspension rod/wire. The surface typically being a ceiling, a wall or a façade.

In a preferred embodiment, the first optical arrangement implements a lens function for spreading the first portion of the luminous output across the target surface and the second optical arrangement implements a diffuser function for diffusing the second portion of the luminous output such that at least part of the second portion is directed away from the target surface. Consequently, the target surface illumination may be accurately controlled whilst the illumination directed away from the target surface by the second optical arrangement reduces the risk of glare as well as obscures the lighting strip from being noticed.

In an embodiment, the first optical arrangement is arranged to generate a spread of the first portion under a first range of angles relative to a plane defined by the respective optical axes of the solid state lighting elements, preferably wherein the first range of angles has a lower end point, i.e. an end point proximal to said plane, of at least 10° such that when the lighting strip is positioned relative to the target surface as described above, light is not directed towards the surface under very shallow angles, i.e. nearly parallel to the surface, in order to reduce light losses and improve the optical efficiency of the lighting strip.

The first optical arrangement further may be arranged to generate a further spread of the first portion under a second range of angles relative to said plane, wherein at least part of the first range of angles lies between said plane and the second range of angles. This way, the first optical arrangement, i.e. the lens arrangement, may generate different luminous profiles in different regions of the target surface, such as for example a more collimated luminous profile in a region of the surface proximal to the lighting strip, e.g. to create a homogeneous or uniform light effect such as a light stripe or the like, and a more diverging luminous profile in a region of the surface distal to the lighting strip to create a decaying luminous intensity adjacent to the light effect, for example to avoid shadowing effects on the target surface.

In order to improve the visibility of the ceiling illumination and to reduce glare, the second optical arrangement preferably includes an exit surface shaped such that emissions from said surface occur from a plane parallel to the optical axes of the SSL elements, for example such that illumination of a region between 10° above the plane and 30° below the plane in which the respective optical axes of the SSL elements lie (which plane also is normal to the elongation direction) is minimized. In case the second optical arrangement further includes a further exit surface shaped such that emissions from said further surface occur under a non-zero angle with said plane, the exit surface preferably producing a higher luminous flux per unit area than the further exit surface in order to achieve this objective.

In a preferred embodiment, the lighting strip is a flexible lighting strip, i.e. a strip that facilitate out of plane bending in respect of the planes defined by the respective major services of the (in this embodiment) flexible carrier of the strip. In this way, light patterns other than linear light patterns may be created by shaping the flexible lighting strip into an appropriate shape, such that more interesting and aesthetically pleasing lighting effects may be achieved.

In an embodiment, the first optical arrangement extends over the solid state lighting elements and the second optical arrangement abuts the first optical arrangement and extends from a region of the at least one major surface adjacent to the solid state lighting elements carried thereon. For example, the first optical arrangement may be made of a first flexible polymer material and the first optical arrangement may be made of a second flexible polymer material different to or the same as the first flexible polymer material. Where the same polymer material is used, the materials may include different fillers and/or have surface textures to tune the optical properties of the respective optical arrangements. This has the advantage that the respective optical arrangements may be formed in a straightforward manner over the flexible carrier. In an example embodiment, the lighting strip further comprises a sleeve or an overmoulding around the carrier, said sleeve or said overmoulding including the first optical arrangement and the second optical arrangement.

In a further embodiment, the solid state lighting elements are distributed on both major surfaces of the ascender of the carrier. This has the advantage that a larger area of the target surface may be illuminated and that symmetrical illumination patterns may be created on the target surface. Alternatively, the lighting strip may comprise two back-to-back L-shaped carriers, or when the ascenders of both L-shaped carriers are integrated into one ascender, said two back-to-back L-shaped carriers together form a T-shaped carrier. The solid state lighting elements may be distributed on the exposed major surfaces of the two L-shaped back-to-back carriers or T-shaped carrier to achieve such symmetrical illumination patterns.

The lighting strip further comprises at least one mounting bracket for mounting the strip to the target surface, wherein the ascender of the carrier is arranged relative to said at least one mounting bracket such that its major surfaces are arranged perpendicular to the target surface and the first optical arrangement faces the target surface. Each mounting bracket for example may be attached to an end portion of the lighting strip or alternatively may comprise a U-shaped profile or the like for receiving the lighting strip such that the mounting bracket may be positioned in any suitable location of the lighting strip.

The at least one mounting bracket is dimensioned such that upon mounting the lighting strip onto the target surface a clearance exists between the lighting strip and the target surface. Such a clearance or spacing assists in creating the desired lighting effect across the target surface.

The lighting strip may further comprise at least one interconnector at an end of the lighting strip for interconnecting multiple lighting strips. This allows for multiple lighting strips to be combined, which is advantageous in terms of configurability and ease of manufacturing, because the lighting strips do not have to be manufactured to their desired size when in use, which may be cumbersome if the lighting strips are intended to be very long.

In an embodiment, the first optical arrangement is arranged to illuminate a target surface area at a first brightness including a peak brightness level and the second optical arrangement is arranged to have a second brightness level, wherein the second brightness level is in a range of 0.1 to 10 times the peak brightness level, preferably wherein the second brightness level is in a range of 0.33 to 3 times the peak brightness level, such that the respective brightness levels of the target surface and light directed away from the target surface, e.g. diffuse light, are comparable to an observer perceiving these brightness levels, e.g. from below the target surface.

According to another aspect, there is provided a surface illumination kit comprising a plurality of the lighting strips of any of the herein described embodiments. Such a kit may be used to illuminate a target surface such as a ceiling in an aesthetically pleasing manner whilst avoiding the lighting strips appearing as dark stripes along the surface as explained in more detail above.

BRIEF DESCRIPTION OF THE DRAWINGS

Embodiments of the invention are described in more detail and by way of non-limiting examples with reference to the accompanying drawings, wherein.

DETAILED DESCRIPTION OF THE EMBODIMENTS

Figure 1:
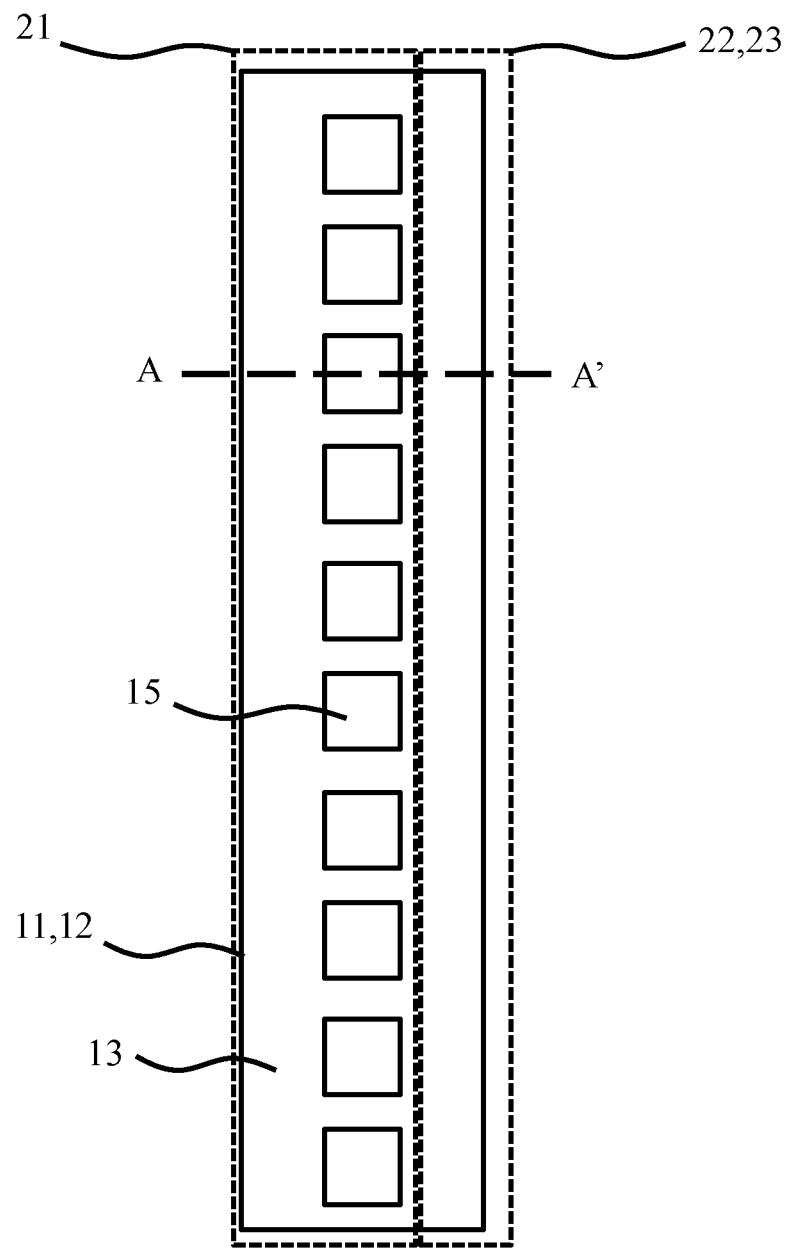
FIG. 1 schematically depicts a lighting strip according to an embodiment.

It should be understood that the Figures are merely schematic and are not drawn to scale. It should also be understood that the same reference numerals are used throughout the Figures to indicate the same or similar parts.

Figure 2:
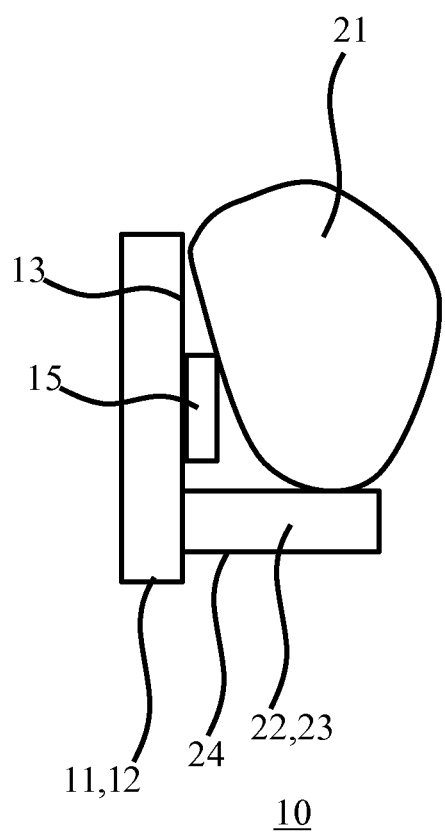
FIG. 2 schematically depicts a cross-section of a lighting strip according to an embodiment.

FIG. 1 schematically depicts a top view and FIG. 2 schematically depicts a cross-sectional view along the line A-A' in FIG. 1 of a lighting strip 10 according to an embodiment of the present invention. The lighting strip 10 comprises an elongated substrate or carrier 11 having an L-shape in cross-section along the line A-A' and having opposing major surfaces 13. At least one of the major surfaces 13 of ascender 12 carries a plurality of SSL elements 15, which SSL elements are typically distributed along the elongation direction of the major surface 13. The carrier 11 may be a rigid carrier, e.g. a printed circuit board, metal strip, or the like although in preferred embodiments the carrier 11 is flexible, e.g. a flexible foil or the like. Such a flexible foil may be made of a polymer such as polyimide and may have embedded therein, e.g. in between opposing layers of the polymer or on the same side as the SSL elements 15, conductive tracks for supplying the SSL elements 15 with electricity. It is noted that flexible lighting strips are well-known per se and it should be understood that any suitable embodiment of such a flexible lighting strip may be contemplated. Similarly, any suitable type of SSL element 15 may be used in the lighting strip 10. In an example embodiment, the SSL elements 15 are top-emitting LEDs, i.e. LEDs arranged to generate luminous output from a top surface of the LED. Such LEDs may be white-light LEDs in some embodiments although other type of LEDs, e.g. coloured LEDs, may also be contemplated. In some embodiments, the SSL elements 15 may be controlled in unison whereas in alternative embodiments the SSL elements 15 may be individually controllable. The SSL elements 15 may be dimmable in some embodiments.

The lighting strip 10 further comprises a first optical arrangement 21 along the elongation direction of each major surface 13 carrying SSL elements 15. The first optical arrangement 21 is typically arranged such that it creates a first redistribution of a first portion of the luminous output of the SSL elements 15. For example, where the lighting strip 10 is positioned relative to a target surface such that the major surfaces 13 of the carrier 11 are arranged perpendicularly to the target surface, the first optical arrangement 21 may face the target surface and redistribute the first portion of the luminous output of the SSL elements 15 towards the target surface.

The lighting strip 10 further comprises at least one cross-bar 22 as a second optical arrangement 23 along the elongation direction of each major surface 13 carrying SSL elements 15, which second optical arrangement 23 for example may be arranged adjacent to the first optical arrangement 21. The second optical arrangement 23 is typically arranged such that it creates a redistribution of a second portion of the luminous output of the SSL elements 15. For example, where the lighting strip 10 is positioned relative to a target surface such that the major surfaces 13 of the carrier 11 are arranged perpendicularly to the target surface, the second optical arrangement 23 may face away from the target surface and redistribute the second portion of the luminous output of the SSL elements 15 in a direction away from the target surface. The first optical arrangement 21 and the second optical arrangement 23 typically implement different optical functions such that the redistribution of the first portion of the luminous output of the SSL elements 15 is different to the redistribution of the second portion of the luminous output of the SSL elements 15. Typically the first portion of redistributed luminous output is in a main direction which is at an angle in the range of 60 to 100 degrees, for example at 90 degrees, with a main direction of the second portion of redistributed luminous output.

For example, in the aforementioned positioning of the lighting strip 10 relative to a target surface such as a ceiling, the first optical arrangement 21 may implement a lens function for spreading the first portion of the luminous output across the target surface 50 and the second optical arrangement 23 may implement a diffuser function for diffusing the second portion of the luminous output away from the target surface. In this manner, light that is directed towards the target surface by the first optical arrangement 21 may be directed towards a target surface in a controlled manner, e.g. in order to create a predetermined luminous profile across the target surface. This for example may include the creation of a desired light effect in the region of the target surface proximal to the lighting strip 10, e.g. an essentially uniform illumination of this region, combined with a gradually decreasing light intensity at increasing distances from the lighting strip in a further region of the target surface distal to the lighting strip 10, with the region and further region of the target surface abutting in preferred embodiments to achieve a continuous lighting effect across the target surface. Such a luminous distribution may further contribute to the illumination of a space adjacent to or below the target surface through reflection and/or scattering of the light redistributed by the first optical arrangement 21 onto the target surface, thereby indirectly illuminating this space.

The second optical arrangement 23 in the aforementioned positioning of the lighting strip 10 relative to the target surface directs light away from the target surface, e.g. towards an observer looking at the target surface. In order to obscure the visibility of the lighting strip 10 to such an observer and to reduce glare experienced by the observer when looking directly towards the lighting strip 10, the second optical arrangement 23 may act as a diffuser to diffuse or scatter the second portion of the luminous distribution of the SSL elements 15 across the space adjacent to or below the target surface. However, it should be understood that the first optical arrangement 21 is not limited to a lens arrangement and the second optical arrangement 23 is not limited to a diffuser arrangement. The first optical arrangement 21 and the second optical arrangement 23 may implement any suitable optical function depending on the chosen application domain in which the lighting strip 10 is to be used.

The first optical arrangement 21 and the second optical arrangement 23 may be arranged as discrete optical elements for each SSL element 15 although in a preferred embodiment the first optical arrangement 21 and the second optical arrangement 23 each are a single body (or part thereof) covering the entirety of SSL elements 15 on a major surface 13 of the carrier 10. For example, the first optical arrangement 21 and the second optical arrangement 23 may form part of a sleeve over the carrier 11 or alternatively may form part of an overmoulding over the carrier 11. To this end, the first optical arrangement 21 may comprise a first polymer, which preferably is a flexible polymer and the second optical arrangement 23 may comprise a second polymer, which preferably is a flexible polymer. The first polymer and the second polymer may be the same polymer, for example in an embodiment where the first optical arrangement 21 and the second optical arrangement 23 form part of a single body. Any suitable (flexible) polymer may be used for this purpose; examples of suitable flexible polymers include but are not limited to polyurethane, polyvinyl chloride and silicone, of which silicone is particularly mentioned due to its flexibility. For more rigid embodiments, poly(methyl methacrylate) and polycarbonate are specifically mentioned.

Where the first optical arrangement 21 comprising such a polymer implements a lens function, this may be achieved with a clear polymer, i.e. a polymer having a high transmissivity, having a thickness and curvature based on its refractive index to achieve the desired lens functionality. Where the second optical arrangement 23 comprising such a polymer acts as a diffuser, this may be achieved by a more translucent polymer portion, e.g. a polymer portion having been chemically treated, e.g. etched, to achieve the diffusive behaviour of the polymer portion and/or by the inclusion of scattering particles for scattering light, i.e. the second portion of the luminous output, originating from the SSL elements 15.

For example, the first optical arrangement 21 and the second optical arrangement 23 may be formed directly on the carrier 11 by placing the carrier 11 inside an injection mould, or extruded the carrier 11 together with one or more polymer materials from which the first optical arrangement 21 and the second optical arrangement 23 are formed.

Alternatively, the first optical arrangement 21 and the second optical arrangement 23 may be made into a sleeve using injection moulding or extrusion after which the carrier 11 including the SSL elements 15 is folded into the sleeve or pulled through the sleeve depending on the sleeve design.

Figure 3:
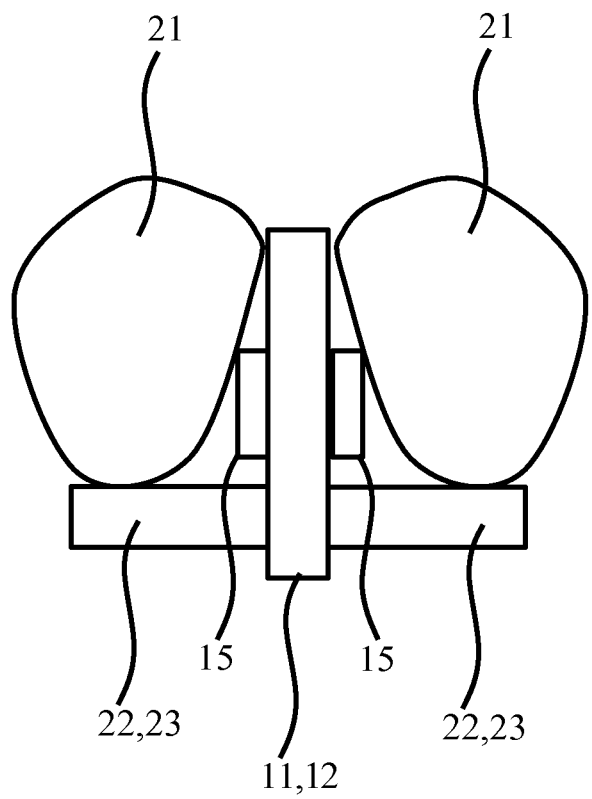
FIG. 3 schematically depicts a cross-section of a lighting strip according to another embodiment.

In an embodiment, the SSL elements 15 are distributed along one of the major surfaces 13 of the ascender 12 of carrier 11, thereby yielding an asymmetric lighting strip 10. This is shown in FIG. 2. Alternatively, as schematically depicted in FIG. 3, which depicts a cross-sectional view along the line A-A' of the lighting strip 10 in FIG. 1 according to an alternative embodiment, each of the major surfaces 13 of ascender 12 carries a distribution of SSL elements 15 along their respective elongation directions, thereby yielding a symmetrical lighting strip 10 in which both distributions of SSL elements 15 are optically coupled to a first optical arrangement 21 and a second optical arrangement 23 as described in more detail above. Alternatively, such a symmetrical lighting strip 10 may be achieved using back-to-back L-shaped carriers 11, also considered as a T-shaped carrier, each carrying SSL elements 15 on their exposed major surfaces of the ascender 12. It is noted for the avoidance of doubt that although in FIG. 3 the respective first optical arrangements 21 and the respective second optical arrangement 23 on the major surfaces 13 of the carrier 11 are shown as discrete optical arrangements, it is of course equally feasible that these respective optical arrangements form part of a single body, e.g. an overmoulding or sleeve enveloping the carrier 11 and SSL elements 15. Alternatively, the respective first optical arrangements 21 may form part of a single body and the respective second optical arrangements 23 may form part of a separate single body, i.e. as a cross-bar 22, which respective bodies combined provide the desired optical functionality for the SSL elements 15.

Figure 4:
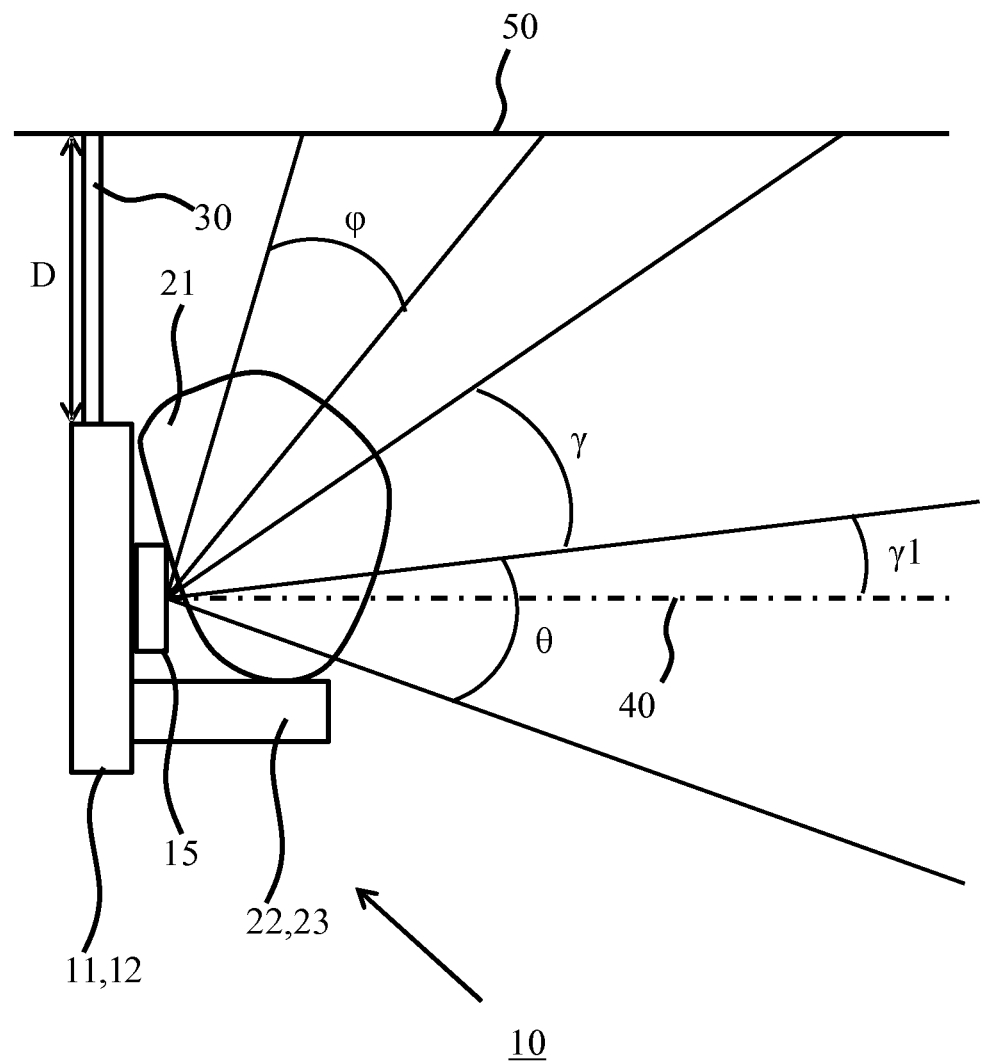
FIG. 4 schematically depicts a cross-section of a lighting strip according to an embodiment mounted on a target surface.

FIG. 4 schematically depicts an embodiment of the lighting strip 10 according to an example embodiment. In this example embodiment, the lighting strip 10, preferably a flexible lighting strip 10, is arranged to illuminate a target surface 50, here a ceiling such as a modular ceiling comprising a plurality of ceiling tiles suspended in a supporting frame. It is noted that an asymmetric lighting strip 10 is shown by way of non-limiting example only and that the lighting strip 10 instead may be a symmetrical lighting strip in which SSL elements 15 are distributed on both major surfaces 13 of the carrier 11 as previously explained.

In this example embodiment, the lighting strip 10 further comprises at least one mounting bracket 30 provided on its ascender 12 for mounting the lighting strip 10 relative to the target surface 50 such that the major surfaces 13 of the carrier 11 are positioned substantially perpendicularly to the target surface 50 and the optical axes 40 of the SSL elements 15, i.e. the centres of the luminous distributions produced by the SSL elements 15, are arranged substantially in parallel with the target surface 50. Any suitable embodiment of such mounting brackets 30 may be contemplated. For example, the lighting strip 10 may comprise a mounting bracket 30 at least at one end and in some embodiments comprises a pair of mounting brackets 30 at its opposite ends. The mounting brackets 30 may be permanently affixed to the lighting strip 10 or may be removable. For instance, each mounting bracket 30 may have a U-shaped profile or the like for receiving the lighting strip 10, which has the further advantage that one or more mounting brackets 30 may be positioned in any suitable location along the lighting strip 10. The lighting strip 10 may further comprise a connector at a terminus or end of the lighting strip for interconnecting multiple lighting strips 10 together, in which case one lighting strip 10 may comprise a male connector and another lighting strip 10 may comprise a female connector as will be immediately understood by the skilled person.

The mounting brackets 30 may be dimensioned such that upon mounting of the lighting strip 10 relative to the target surface 50, a clearance D between the lighting strip 10 and the target surface 50 exists. Such a clearance D may be chosen to ensure that the light redistributed by the first optical arrangement 21 illuminates the intended region of the target surface 50. Any suitable clearance D may be contemplated; in an example embodiment, the clearance D is selected in a range from 5 to 10 cm although other clearances may be contemplated. The mounting brackets 30 may be mounted to the target surface 50 in any suitable manner. For example, in case of the target surface 50 comprising a modular ceiling, the modular ceiling may comprise any suitable securing arrangement, e.g. a screw fitting, bayonet fitting, a click system, or the like for engaging with the mounting brackets 30. Alternatively, the mounting brackets 30 may comprise clips or the like for clipping the mounting brackets to the modular ceiling, e.g. to the support frame of the ceiling tiles. Other suitable means of securing the mounting brackets 30 against the target surface 50 will be immediately apparent to the skilled person.

Where the target surface 50 is a ceiling, in an embodiment the first optical arrangement 21 is arranged to generate a spread of the first portion of the luminous distribution produced by the SSL elements 15 under a range $\varphi$ of angles relative to a plane defined by the respective optical axes 40 of the solid state lighting elements 15, i.e. the plane in which the respective optical axes 40 of the SSL elements 15 lie. This spread for example may be for creating an essentially uniform ceiling illumination in a region of the ceiling proximal to the lighting strip 10, such as to create a substantially uniform ceiling illumination of half a ceiling tile adjacent to the lighting strip 10 in case the lighting strip 10 is attached to the support frame in which the ceiling tile is suspended. For instance, in case of square ceiling tiles having a dimension of 60 cm×60 cm, a region of the ceiling tile having a width of 30 cm and running parallel to the lighting strip 10 may be illuminated in this manner.

The first optical arrangement 21 may be further arranged to generate a further spread of the first portion of the luminous distribution produced by the SSL elements 15 under a range $\gamma$ of angles relative to the plane defined by the respective optical axes 40 of the solid state lighting elements 15, which further spread may illuminate a further region of the ceiling, which further region preferably abuts the region illuminated by the first spread under the range φ of angles such that the range γ of angles lies between this plane and the range φ of angles. This further spread for example may be used to create a continuously decaying luminous intensity, i.e. a fading effect, adjacent to the essentially uniform ceiling illumination, in which the luminous intensity drops off with increasing distance to the lighting strip 10. In order to minimize the amount of light redistributed by the first optical arrangement 21 within the range γ of angles, this range preferably is delimited at least 10° above the plane (as indicated by angle γ1) in which the respective optical axes 40 lie such that the amount of light redirected by the first optical arrangement 21 in substantially parallel directions with the ceiling is minimized. Furthermore, it will be understood by the skilled person that the light redistributed by the first optical arrangement 21 preferably does not extend beyond the plane the plane in which the respective optical axes 40 lie to avoid glare.

Figure 5:
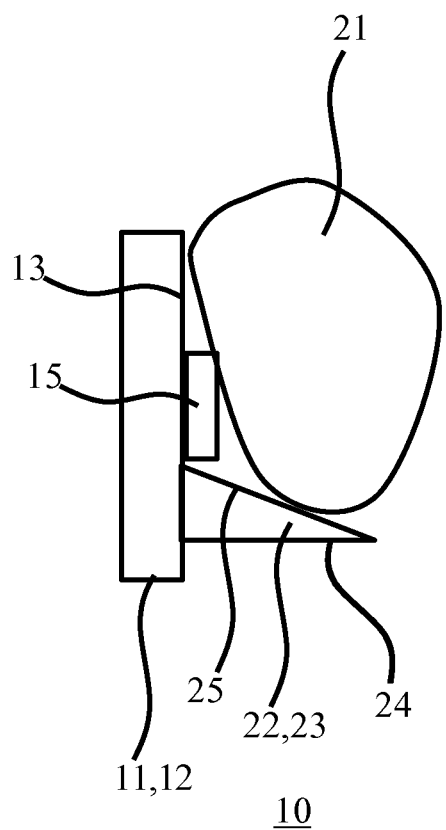
FIG. 5 schematically depicts a cross-section of a lighting strip according to yet another embodiment.
Figure 6:
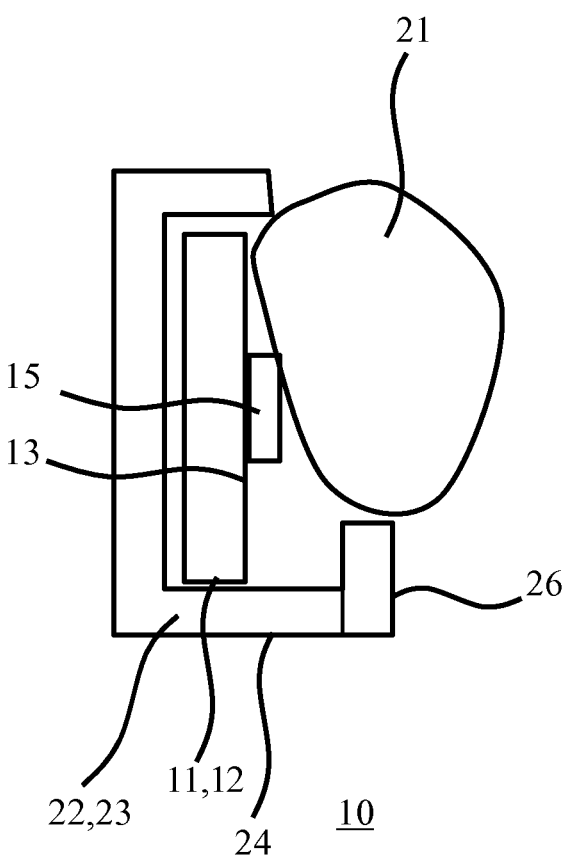
FIG. 6 schematically depicts a cross-section of a lighting strip according to still another embodiment.

For this reason, as well as to increase the visibility of the illuminance of the target surface 50, e.g. a ceiling, created with the first optical arrangement 21, the illuminance within the angular range θ, which preferably ranges from 10° above the plane in which the respective optical axes 40 to 30° below this plane, is minimized. To this end, the cross-bar 22, being second optical arrangement 23 and extending at 90 degrees with the ascender 12, when used as a diffuser preferably includes a light exit surface 24 shaped such that emissions from this surface occur from a plane parallel to the optical axis of the SSL elements 15, e.g. a horizontal plane, as this minimises the amount of light redistributed into the aforementioned angular range θ. In this embodiment, the (planar) light exit surface 24 of the second optical arrangement 23 is arranged substantially in parallel with the plane in which the respective optical axes 40 lie. It is noted that the second optical arrangement 23 does not have to be entirely planar, for example where the first optical arrangement 21 and the second optical arrangement 23 form part of a single body. An example embodiment of a suitable alternative for the cross-bar 22 as second optical arrangement 23 is schematically shown in FIG. 5, in which the second optical arrangement 23 combines a further entry surface 25 with a planar exit surface 24. The further entry surface 25 may be a non-planar surface or a planar surface under a non-zero angle with the plane of the planar exit surface 24. Moreover, as schematically depicted in FIG. 6, in which the second optical arrangement 23 is shown as an overmoulding of ascender 12 of the carrier 11, where the cross-bar 22, being second optical arrangement 23, comprises at least one further surface 26 under a non-zero angle with the planar exit surface 24, which at least one further surface 26 may be a non-planar surface portion of the second optical arrangement 23 or a planar surface portion under a non-zero angle with the planar exit surface 24, the planar surface 24 may be designed to produce a higher luminous flux per unit area than the further surface 26, and preferably to produce a much higher luminous flux per unit area to minimize the amount of light straying into this angular range. However, it is noted for the avoidance of doubt that the second optical arrangement 23 does not necessarily include a planar exit surface 24 but may have any suitably shaped exit surface(s), for which the luminous flux preferably is controlled in any suitable manner in order to ensure that the amount of light straying into the aforementioned angular range is reduced or minimized.

Upon returning to FIG. 4, in some embodiments, the second optical arrangement 23 is designed to have a brightness comparable to the ceiling brightness immediately above the lighting strip 10, e.g. the brightness created by the luminous distribution φ. The brightness of the second optical arrangement 23 may be in a range of 0.1 to 10 times this ceiling brightness and in a preferred embodiment is in the range of 0.33 to 3 times this ceiling brightness. Where reference is made to the ceiling brightness, this may refer to the peak brightness level of the ceiling brightness where this brightness is not constant across the ceiling. These brightness ratios are particularly suitable for creating functional (comfortable) lighting within a space including the target surface 50 although it should be understood that other ratios may be contemplated. For example, if the lighting strip 10 is used for creating a decorative accent on the ceiling rather than comfortable lighting, a higher portion of direct light, i.e. light redistributed by the second optical arrangement 23, may be contemplated. However, in preferred embodiments, the direct light has a peak luminance not exceeding 10-20 kcd/m2 (kcd=kilo Candela) to reduce the risk of glare and to ensure that the illuminance pattern created on the target surface remains sufficiently visible.

The lighting strips 10 according to embodiments of the present invention may be bundled into a surface illumination kit, which kit may be deployed to illuminate a surface such as a ceiling.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A lighting strip comprising:
    an L- or T-shaped carrier having an ascender and at least one cross-bar, and carrying as a light source, on at least one major surface of its ascender, a plurality of solid state lighting elements defining an optical axis and being distributed along an elongation direction of said carrier, the ascender further being provided with mounting means for mounting to a surface;
    at least one first optically transmissive-arrangement along said elongation direction and being in axial direction in front of the light source for creating a first redistribution of a first portion of the luminous output of said solid state lighting elements; and
    the at least one cross-bar being a second optical arrangement along said elongation direction for creating a second redistribution of a second portion of the luminous output of said solid state lighting elements, wherein the first redistribution is different to the second redistribution,
    wherein the mounting means is at least one mounting bracket for mounting the lighting strip to a target surface, wherein the carrier is arranged relative to said at least one mounting bracket such that its major surfaces are arranged perpendicular to the target surface, the optical axis of the solid state elements is arranged substantially in parallel with the target surface, and the first optical arrangement faces the target surface when mounted to the target surface.

2. The lighting strip of claim 1, wherein the first optical arrangement implements a lens function for spreading the first portion of the luminous output across a target surface and the second optical arrangement comprises a translucent portion and faces away from the target surface and implements a diffuser function for diffusing the second portion of the luminous output such that at least part of the second portion is directed away from the target surface.

3. The lighting strip of claim 2, wherein the first optical arrangement is arranged to generate a spread of the first portion under a first range of angles ($\gamma$) relative to a plane defined by the respective optical axes of the solid state lighting elements, preferably wherein the first range of angles has an end point ($\gamma 1$) proximal to said plane of at least 10°.

4. The lighting strip of claim 3, wherein the first optical arrangement further is arranged to generate a further spread of the of the first portion under a second range of angles ($\phi$) relative to said plane, wherein at least a part of the first range of angles ($\gamma$) lies between said plane and the second range of angles.

5. The lighting strip of claim 3, wherein the second optical arrangement includes an exit surface shaped such that emissions from said surface occur from a plane parallel to the optical axis of the solid state lighting elements.

6. The lighting strip of claim 5, wherein the second optical arrangement further includes a further exit surface shaped such that emissions from said further surface occur under a non-zero angle with said plane, the exit surface producing a higher luminous flux per unit area than the further exit surface.

7. The lighting strip of claim 1, wherein the first optical arrangement extends over the solid state lighting elements and the second optical arrangement abuts the first optical arrangement and extends from a region of the at least one major surface adjacent to the solid state lighting elements carried thereon or from a side surface of the carrier.

8. The lighting strip of claim 1, wherein the lighting strip is flexible.

9. The lighting strip of claim 8, wherein the first optical arrangement is made of a first flexible polymer material and the second optical arrangement is made of a second flexible polymer material that is the same as or different to the first flexible polymer material.

10. The lighting strip of claim 1, further comprising a sleeve or an overmoulding around said carrier, said sleeve or said overmoulding including being around the first optical arrangement and the second optical arrangement.

11. The lighting strip of claim 1, wherein the solid state lighting elements are distributed on both major surfaces of the ascender of the carrier or wherein the lighting strip comprises back-to-back carriers and the solid state lighting elements are distributed on the exposed major surfaces of the back-to-back carriers.

12. The lighting strip of claim 1, wherein the at least one mounting bracket is dimensioned such that upon mounting the lighting strip onto the target surface the cross-bar extends parallel to the target surface and a clearance exists between the lighting strip and the target surface, and the light sources illuminate the space adjacent/below the target surface via the first optical arrangement.

13. The lighting strip of claim 1, further comprising at least one interconnector at an end of the lighting strip for interconnecting multiple lighting strips.

14. The lighting strip of claim 1, wherein the first optical arrangement is arranged to illuminate a target surface area at a first brightness including a peak brightness level and the second optical arrangement is arranged to have a second brightness level, wherein the second brightness level is in a range of 0.1 to 10 times the peak brightness level, preferably wherein the second brightness level is in a range of 0.33 to 3 times the peak brightness level.

15. A surface illumination kit comprising a plurality of the lighting strips of claim 1.

* * * * *